(12) United States Patent
George et al.

(10) Patent No.: US 7,232,506 B2
(45) Date of Patent: Jun. 19, 2007

(54) SYSTEM AND METHOD FOR FEEDFORWARD CONTROL IN THIN FILM COATING PROCESSES

(75) Inventors: Mark George, Santa Rosa, CA (US); Evan Craves, Santa Rosa, CA (US)

(73) Assignee: Deposition Sciences, Inc., Santa Rosa, CA (US)

( * ) Notice: Subject to any disclaimer, the term of this patent is extended or adjusted under 35 U.S.C. 154(b) by 0 days.

(21) Appl. No.: 10/960,621

(22) Filed: Oct. 8, 2004

(65) Prior Publication Data

US 2005/0115502 A1 Jun. 2, 2005

Related U.S. Application Data

(60) Provisional application No. 60/509,248, filed on Oct. 8, 2003.

(51) Int. Cl.
*C23C 14/34* (2006.01)
(52) U.S. Cl. .......................... 204/192.13; 204/192.12; 204/298.03; 204/298.07
(58) Field of Classification Search ........... 204/192.12, 204/192.13, 298.03, 298.07
See application file for complete search history.

(56) References Cited

U.S. PATENT DOCUMENTS

| | | | |
|---|---|---|---|
| 4,428,811 A * | 1/1984 | Sproul et al. | 204/192.13 |
| 4,851,095 A | 7/1989 | Scobey et al. | |
| 4,883,574 A | 11/1989 | dos Santos Pereina Ribeiro | |
| 4,895,631 A | 1/1990 | Wirz et al. | |
| 5,292,417 A * | 3/1994 | Kugler | 204/192.13 |
| 5,556,520 A | 9/1996 | Latz | |
| 5,561,599 A | 10/1996 | Lu | |
| 5,674,194 A | 10/1997 | Jung et al. | |
| 5,692,485 A | 12/1997 | Maki et al. | |
| 5,849,162 A | 12/1998 | Bartolomei et al. | |
| 5,942,089 A * | 8/1999 | Sproul et al. | 204/192.13 |
| 6,106,676 A * | 8/2000 | Terry et al. | 204/192.13 |
| 6,106,785 A | 8/2000 | Havlena et al. | |
| 6,132,563 A | 10/2000 | Frach et al. | |
| 6,424,906 B1 | 7/2002 | Zhu et al. | |
| 6,537,428 B1 * | 3/2003 | Xiong et al. | 204/192.13 |

OTHER PUBLICATIONS

Ziegler, J.G. and N.B. Nichols, "Optimum Settings for Automatic Controllers," Tras. ASME, 64, p. 759 (1942).

* cited by examiner

*Primary Examiner*—Rodney G. McDonald
(74) *Attorney, Agent, or Firm*—Duane Morris, LLP

(57) ABSTRACT

A system and method for feedforward control in thin film coating processes. A standard PID feedback control system that continuously monitors two or more process variables in a reactive sputtering process is combined with a feedforward control system to improve system performance. The control system enables much faster stabilization of the reactive sputtering process during target start-up, and improves control of the process once a steady-state operating condition has been reached following target start-up.

26 Claims, 8 Drawing Sheets

Block diagram of a PID feedback control combined with a feedforward control mechanism according to the current invention

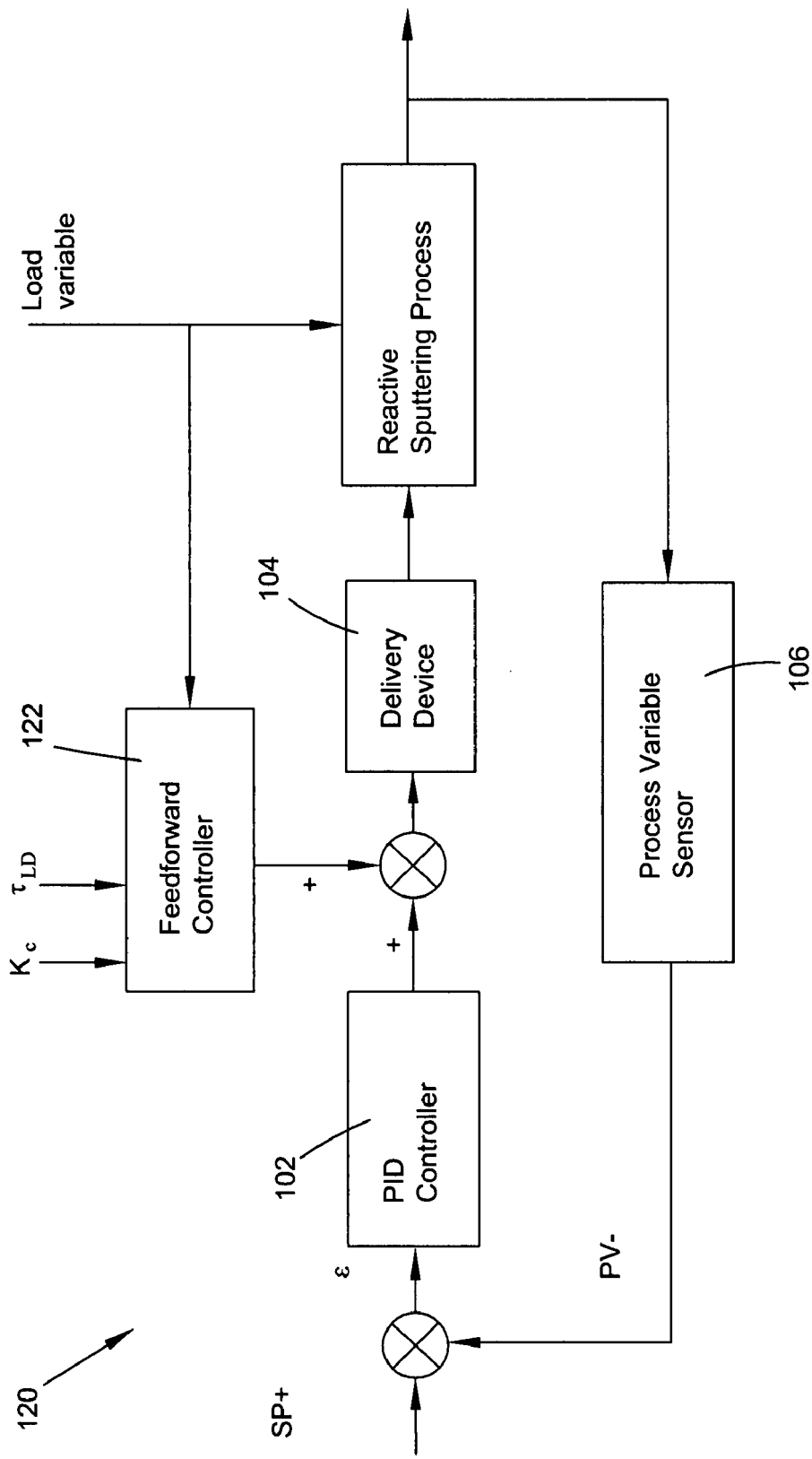
Figure 3: Block diagram of a PID feedback control combined with a feedforward control mechanism according to the current invention

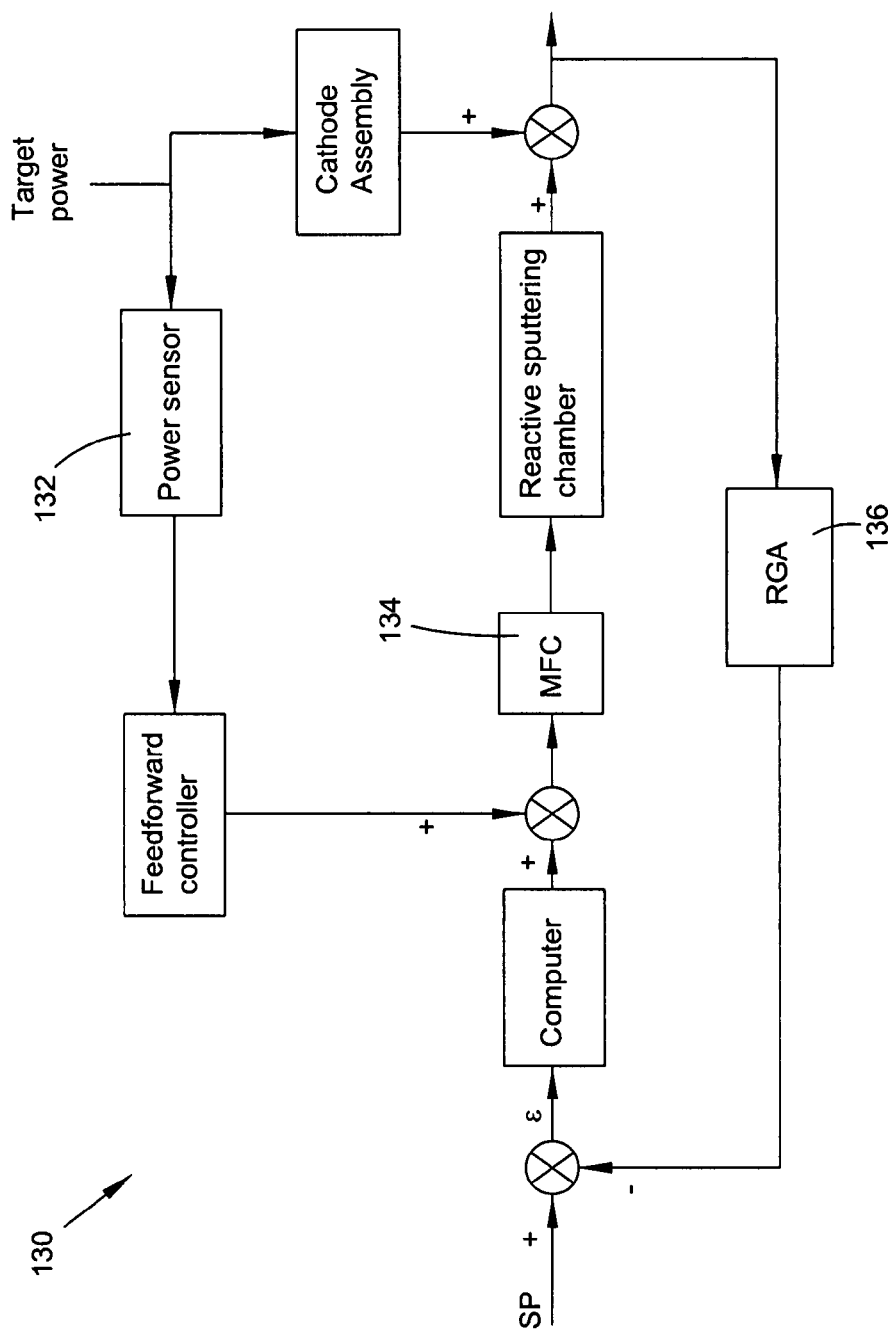
Figure 4: Reactive sputtering system equipped with feedforward control and a feedback trim element with power as the load variable and oxygen mole fraction as the controlled variable

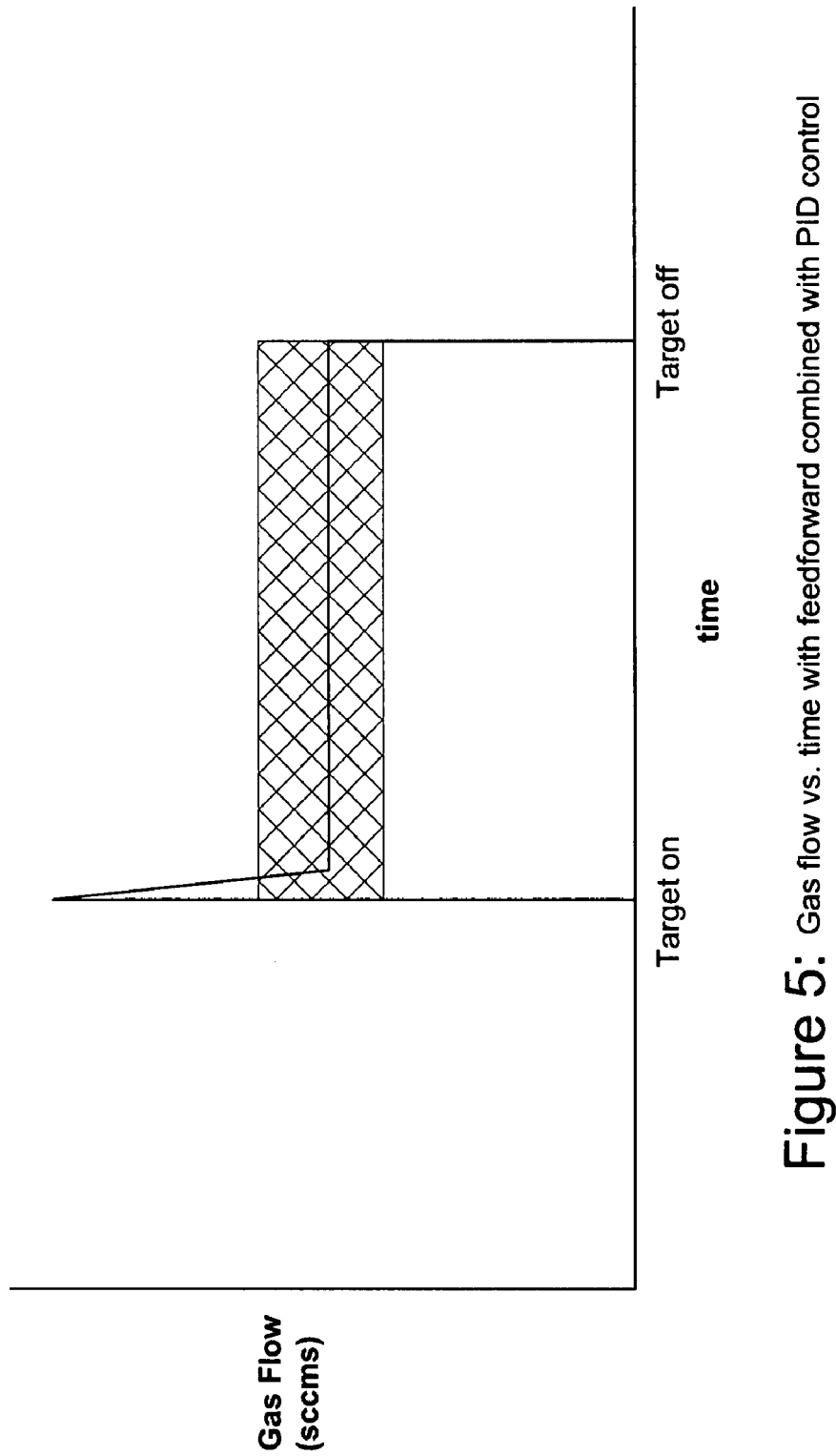
Figure 5: Gas flow vs. time with feedforward combined with PID control

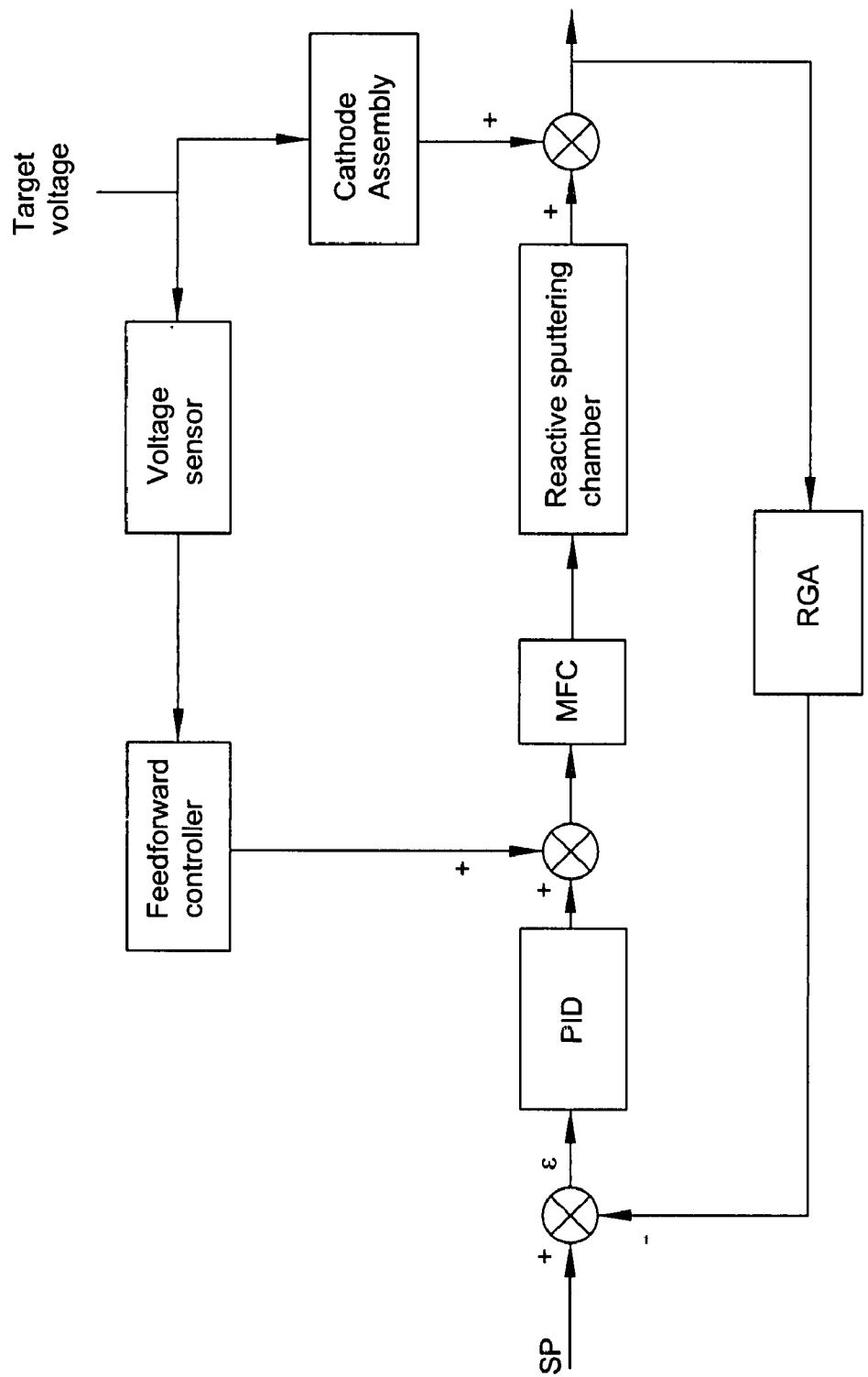
Figure 6: Voltage as the load variable

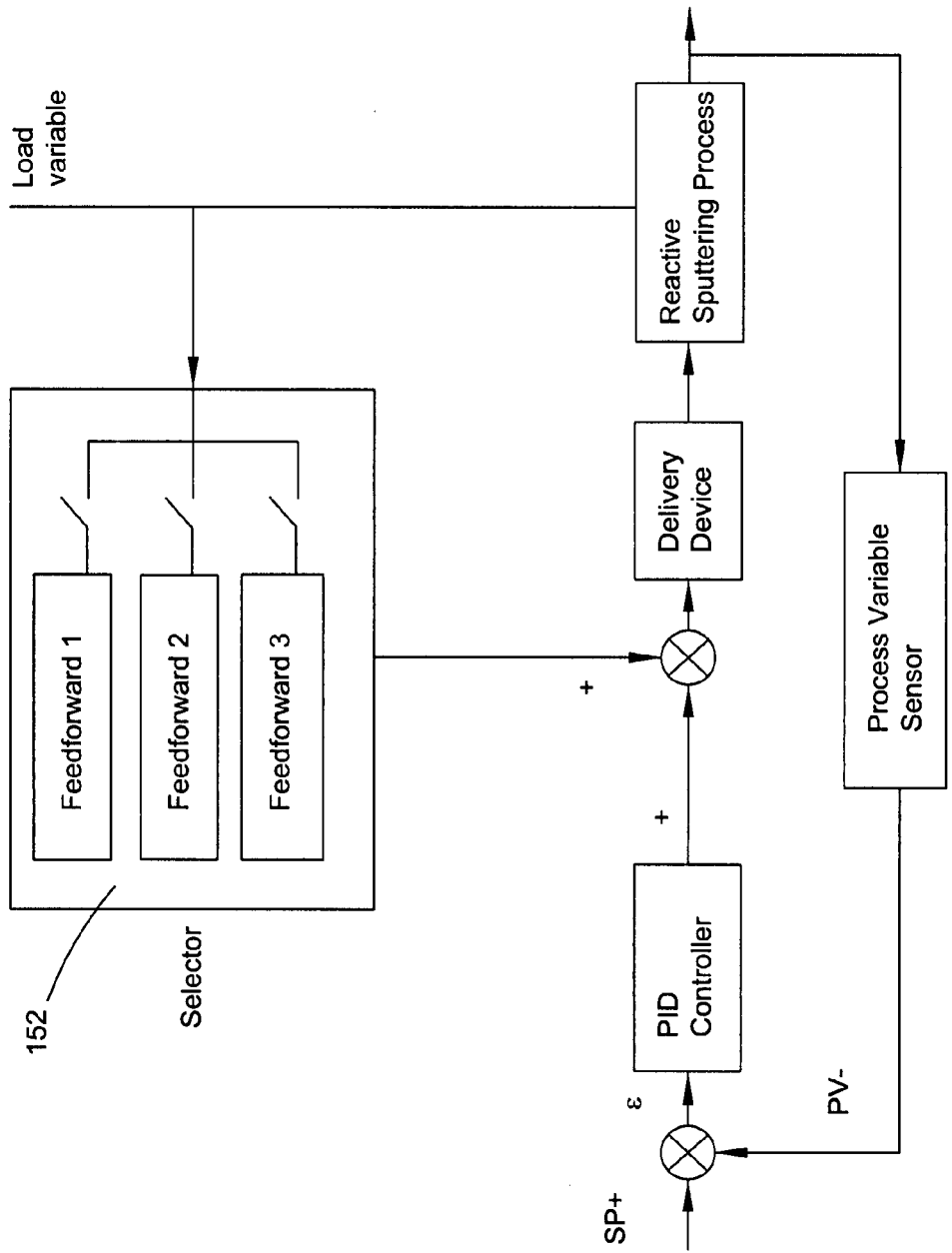
Figure 7: Reactive Sputtering Process with multiple feedforward controls

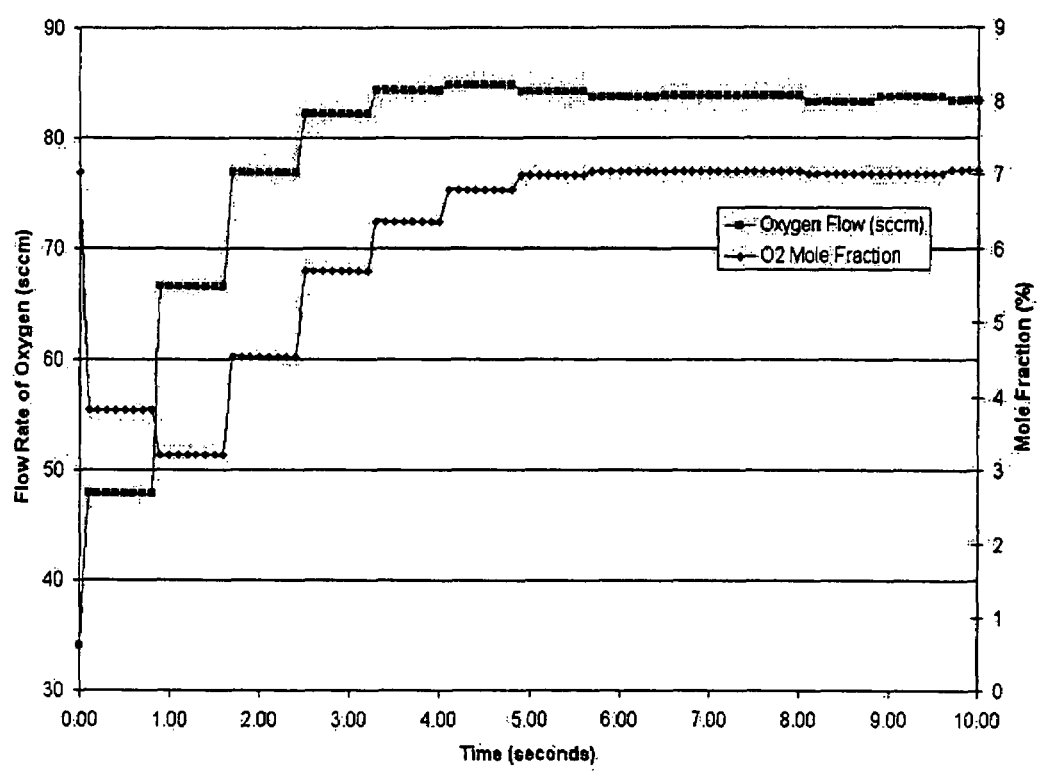
Figure 8. Coater response to a target start with P, I and D control.

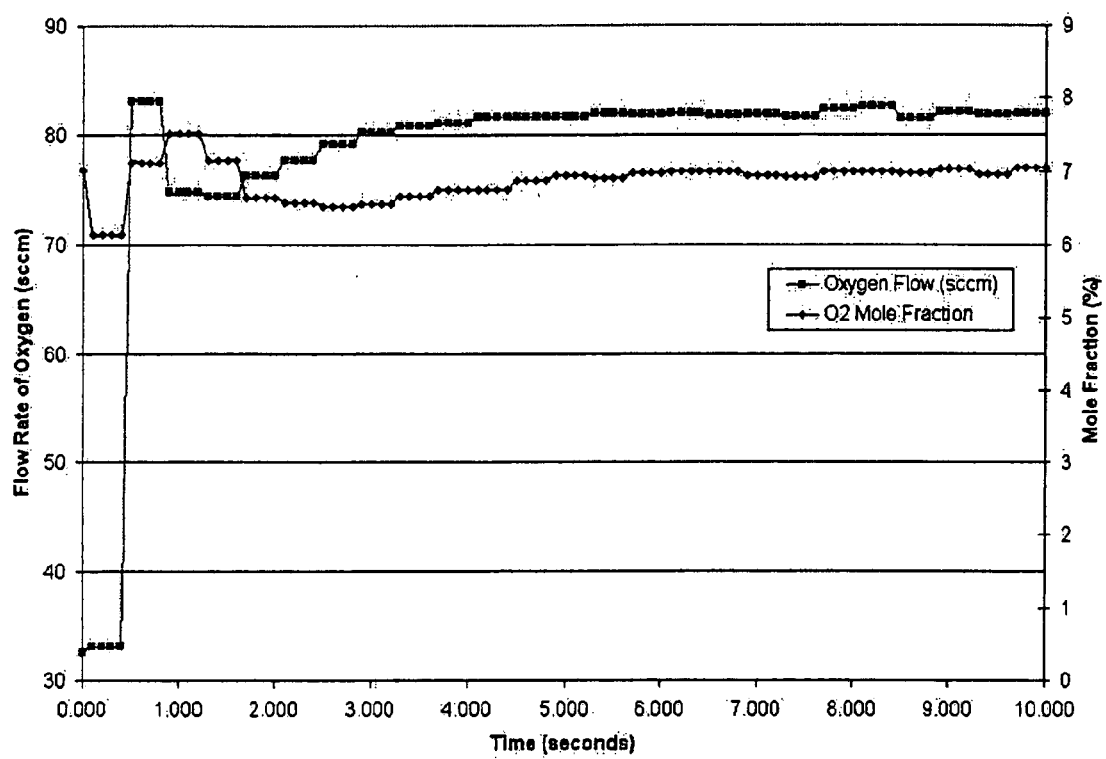
Figure 9. Coater response to a target start with feedforward gain and lead and PID feedback trimming.

SYSTEM AND METHOD FOR FEEDFORWARD CONTROL IN THIN FILM COATING PROCESSES

CLAIM OF PRIORITY

This application claims the filing date priority of U.S. patent application Ser. No. 60/509,248 filed Oct. 8, 2003, the content of which is hereby incorporated by reference.

BACKGROUND OF THE INVENTION

Reactive sputtering systems are finding increasing use for the manufacture of multi-layer thin film coatings. Multi-layer thin film coatings comprising alternating layers of two or more materials are typically formed in sputtering systems by alternate operation of two (or more) targets composed of the base materials. In a reactive sputtering system, a reactive gas is introduced into the sputtering chamber so that atoms of the material sputtered from the target onto the substrate(s) are converted into the desired compound such as a metal oxide or metal nitride. In reactive sputtering systems, it is desirable to operate the system so that all of the sputtered material is converted to the desired chemical compound without poisoning the sputtering target. However, it is difficult to maintain the target in the desired non-poisoned mode while still obtaining stochiometric oxidation of the sputtered material in the growing film. If an insufficient amount of reactive gas (e.g. oxygen) is present, the growing film will be absorbing and have incorrect stochiometry. If the amount of reactive gas is too large, the target becomes poisoned, i.e., the sputtering surface of the target reacts with the reactive gas to form a compound (e.g. an oxide). Once the target becomes poisoned, the deposition rate greatly decreases compared to an unpoisoned target.

It is critical to maintain a stable reactive gas concentration in the reactive sputtering chamber at the desired level for optimum performance of the sputtering system. Thus the reactive gas concentration provides one critical process variable. The use of a steady state control to admit the reactive gas into the sputtering chamber would not be an adequate control mechanism because the consumption rate of the reactive gas varies with the state of the target and the conditions inside the sputtering chamber.

It is well known to employ a control algorithm, such as a PID (Proportional, Integrative, Derivative) loop, to control the admission of reactive gas into the chamber to maintain steady state operation of the target. Control of the flow rate of reactive gas into a reactive sputtering chamber is important to ensure stochiometry of the thin film throughout a layer while maintaining the relatively high sputter rates of the target in an un-poisoned state.

The difficulty of maintaining steady state operation of the target in the desired mode are greatly increased during the first few seconds of operation after target start-up. In prior art reactive sputtering systems having a well-tuned PID loop to control the reactive gas concentration in the chamber, it typically takes between four to eight seconds to stabilize the reactive gas concentration at the desired steady-state level. These stabilization times are about the best that can be achieved due to the nature of the PID loop and computing hardware that is typically employed in prior art systems.

In the manufacture of multi-layer thin film coatings where the process of forming the coating requires repetitive target starts, the time required to achieve steady-state operation of a target can be crucial for accurate control of stochiometry, deposition rates, and hence the optical performance of the coating. Undesirably long stabilization times can result in poor optical performance of the completed film. In the ideal case, the target would achieve steady state, controlled operation sufficiently quickly that the substrates being coated are never subjected to film deposition during process stabilization.

The problem of film inhomogeneity during target start-up and stabilization are particularly acute in a drum configuration sputtering system where the drum carriage typically rotates at about 45 to 120 rpm. At these rotation rates, each substrate passes under the target between four and eight times during target stabilization, leading to significant deposition of inhomogeneous layers in the coating. This is particularly true of thinner layers where the time needed for target start-up and stabilization forms a significant percentage of the overall layer deposition time. For a drum configuration reactive sputtering system, it would be of significant advantage to have the target brought to stable, steady-state operation and to have the reactive gas flow stabilized in less time than required for one revolution of the drum, i.e., in less than one second.

Two general methods have been employed in the prior art to solve the problem of poor process control during target start-up. PID control of the oxygen flow during the main body of the layer deposition can be used, but during layer start-up the stabilization time of a PID loop is too long to provide good performance. To address the poor performance of a PID loop during target start-up, various approaches are used. One method includes ramping the power to the sputtering target on a pre-determined profile to reach the steady state value. The reactive gas flow may be ramped in accordance or set to a fixed value during stabilization, with reactive gas flow control being returned to the PID loop after target stabilization. However, neither of these approaches achieve steady-state operation of the target in a desirable time frame. This causes the film composition to be inhomogeneous over a complete layer. For multi-layer designs incorporating various layer thicknesses the contribution to the total thickness of any given layer can vary markedly, making the attainment of precision optical designs problematic.

Another method employed in the prior art includes the use of target shutters that shield the target during target start-up to prevent the deposition of target material on the substrates until the target stabilizes. Once the steady state condition has been achieved the target shields are removed and deposition on the substrates begins. The difficulty with this approach is that as soon as the shutters are removed, the conditions at the target change rapidly (influx of oxygen from areas beyond the shutters and so forth) requiring the system to reach a new steady-state operating condition. During this transition time, the substrates (or some portion of a large substrate) may be exposed to varying fluxes of sputtered material resulting in non-uniform deposition over the substrate or substrates. The shields also require undesirable extra mechanical hardware that must be manipulated in the vacuum environment, adding expense and requiring additional maintenance and downtime of the system.

The target start-up and time frame needed to reach a stable operating process is not the only area in which a standard PID loop provides insufficient control to maintain a coating system in a stable state. Metal oxides are commonly used as coating materials, with the stability of the system during coating being determined by various factors such as oxygen flow, pumping of the chamber, and the rate of consumption of the oxygen in the oxidizing process. For any given system (with no targets running and no film being deposited), a pumping curve showing pressure vs. reactive gas flow can be determined experimentally, the pressure for a given flow being dependent on variables such as the speed of the vacuum pump and the volume and configuration of the sputtering chamber. When the system is running and depositing material on substrates, the pressure for a given reactive gas flow changes because the film being deposited also functions as a "pump" for the reactive gas by consuming the free oxygen into the growing thin film.

The magnitude of the "pumping" effect the film has on the reactive gas pressure depends on several variables specific to each machine configuration and operating parameters. The behavior of a system at various flows of reactive gas follows a well known characteristic curve.

A set of such curves are shown in FIG. 1. With reference to FIG. 1, the pump line 10 shows the behavior of the system when no target is operating, while the other three curves 20, 30, and 40 show the system states for three different powers at which a target operates. The curve 20 shows that at a low power, when a relatively small amount of material is being deposited, there is little deviation from the standard pump curve. As the power to the target is increased, the pumping effect of the film becomes greater, leading to the characteristic S-shape seen in the curves 30 and 40. The regions of these S-shape curves having negative slopes correspond to non-equilibrium states of the system and, in practice, control is not sufficient to allow one to follow these curves as the reactive gas flow increases, especially for large industrial systems. Instead the target will poison, causing the system to suddenly jump from one point on the curve to another, as illustrated by the dashed arrow 45 on the curve 40. As the pressure decreases, the system will then jump back down to a metallic mode as illustrated by the arrow 47 resulting in a hysteresis curve. The behavior of reactive sputtering systems on these operating curves is well known.

It is also known that operating states giving the best film qualities often require one to operate very near conditions in which the system is no longer stable. Two such states are those that occur just below and just above the knee 42 on the curve 40. If the system is operating at a point along the curve 40 that is too far to the left of the knee 42, then the target is operating in the metallic mode which, although providing a rapid coating rate, often results in formation of absorbing films with materials such as Nb2O5 and TiO2 that are typically difficult to oxidize.

The closer the system is to the knee of the curve, the more oxidized the deposited film becomes, but the greater the likelihood that any perturbation in system conditions will cause the system to become unstable before a standard PID control system can compensate for the changed conditions. It is also possible to operate just above the knee of the curve where the target operates in a barely poisoned condition. This operating point also suffers from the difficulties in keeping the system stable and preventing any small change in conditions from moving the system into an unstable state.

There remains a need for improved control in reactive sputtering system. It is an object of the present invention to obviate the deficiencies of the prior art reactive sputtering systems. This and many other of the objects and advantages of the present invention will be readily apparent to one skilled in the art to which the invention pertains from a perusal of the claims, the appended drawings, and the following detailed description of the preferred embodiments.

BRIEF DESCRIPTION OF THE DRAWINGS

FIG. 3 is a block diagram of a PID feedback control system with feedforward control.

FIG. 4 is a block diagram of a PID feedback control system with feedforward control where the target power is the load variable and reactive gas pressure or mole fraction in the chamber is the control variable.

FIG. 5 is a graph illustrating the reactive gas flow vs. time in a theoretical system having a PID feedback control system with feedforward control.

FIG. 6 is a block diagram of a PID feedback control system with feedforward control where the target voltage is the load variable and reactive gas pressure or mole fraction in the chamber is the control variable.

FIG. 7 is a block diagram of a PID feedback control system with feedforward control where the algorithm for the feedforward control is selectable.

FIG. 8 is a graph illustrating the oxygen flow rate vs. time for the system operated according to Table 1 with PID feedback control.

FIG. 9 is a graph illustrating the oxygen flow rate vs. time for the system operated according to Table 1 with PID feedback control and feedforward control.

DESCRIPTION

With reference to the drawings, like numerals represent like components throughout the several drawings.

In one aspect, the present invention provides a process controller equipped with a closed loop feedforward control element coupled with known PID controllers. This feedforward element permits achievement of steady-state operation in a reactive sputtering system four to ten times faster than with the known PID controllers. Some examples of the type of reactive sputtering systems with which this aspect of the invention may be employed are described in detail in U.S. Pat. No. 5,849,162 (Bartolomei et.al) and U.S. Pat. No. 4,851,095 (Scobey et.al.)

The employment of feedforward control assists in achieving stable, controlled deposition process behavior in the sputtering chamber within one second of target start-up. The feedforward control system in combination with different PID trimming methods that contain different combinations of controlled and manipulated variables greatly improve the time required to obtain steady-state operating conditions of a reactive sputtering system.

Figure 1:
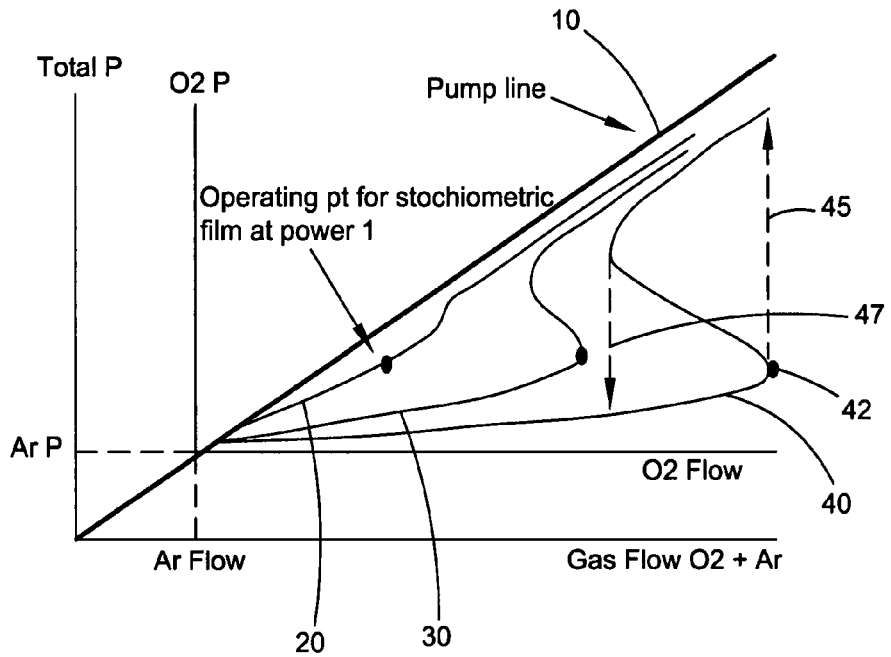
FIG. 1 is an illustration of the operating curves of prior art reactive sputtering systems.
Figure 2:
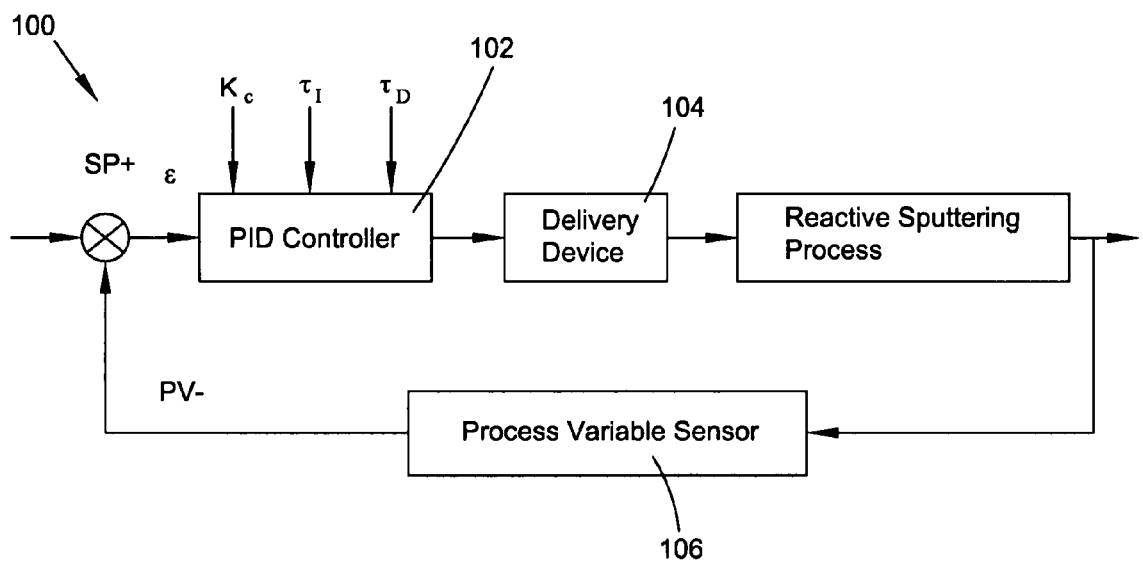
FIG. 2 is a block diagram of a prior art PID feedback control system.

A standard PID control loop, as utilized in a reactive sputtering process, is illustrated in FIG. 2. With reference to FIG. 2, PV represents the process variable, SP represents the set point for the process variable, $\epsilon$ represents the error, and $K_c$, $\tau_I$ and $\tau_D$ are respectively the proportional, integral, and derivative terms used in PID control algorithms. The PID control loop 100 includes a PID controller 102, a delivery device 104, and a process variable sensor 106.

In a typical reactive sputtering process, the reactive gas pressure or the reactive gas mole fraction within the chamber is a provides the typical operational variable for the controlled process variable. In a system where the reactive gas pressure or mole fraction is the process control variable, the delivery device 104 may be a mass flow controller that controls the mass flow rate of the gas into the chamber. The process variable sensor 106 may be an optical sensor or an RGA.

The PID controller 102 provides a signal to the delivery device 104 dictating how much gas to deliver to the system to meet the selected set point SP. The process variable sensor 106 measures the process variable PV and the difference between the measured value of the controlled variable and the desired set point is determined to provide the error. The error is then provided into the PID controller 102 which then provides feedback to the delivery device 104 to reduce the measured error to zero. This feedback system cannot prevent disturbances to the sputtering system because it reacts to a measured error and feeds the error back to the PID controller. The time it takes to correct the error is determined by the rate at which the process variable sensor can measure changes in the system and provide the measured changes to the PID controller plus the time for the PID controller to signal the correction that needs to be made and the time it takes for the correction to be implemented. The delay is often too great in obtaining (in the case of target startup) or returning (after a disturbance to the system) to the desired operating set point thus allowing a significant amount of film deposition during the transient operating conditions resulting in lesser quality thin films.

In one aspect, the present invention improves the control in a reactive sputtering system by adding a feedforward control element to the standard PID control. FIG. 3 illustrates a block diagram of a control system according to one aspect of the present invention. With reference to FIG. 3, the control system 120 adds a feedforward controller 122 to the control loop illustrated in FIG. 2. The feedforward control system measures a load variable (or disturbance) and provides a signal to vary the process variable in response to a variance in the load variable. The load variable must be chosen such that any variances measured or sensed in the load variable would effect a variance in the controlled variable. The load variable must also be such that variances in it occur and can be measured before a corresponding variance occurs in the controlled variable resulting in a disturbance to the system. In other words, for the feedforward system to be effective a degree of anticipation must be used to predict how the measured disturbance will affect the controlled variable in some finite span of time. In one aspect of the present invention the feedforward control function is shown below:

$$p_f(t) + \tau_{LG}\frac{dp_f}{dt} = K_f\left(L(t) + \tau_{LD}\frac{dL}{dt}\right)$$

Where $p_f(t)$=feedforward controller output
$L(t)$=load variable
$K_f$=feedforward gain
$\tau_{LD}$=feedforward lead time
$\tau_{LG}$=feedforward lag time This equation allows for anticipation of the load change and also anticipates the controller output. There are known analysis schemes used to develop optimal values for gain, lead and lag, e.g., as described in J. G. Ziegler and N. B. Nichols, "Optimum Settings for Automatic Controllers, Tras. ASME, 64 p. 759 (1942). Combining this feedforward element with a well-tuned feedback controller creates a very powerful control mechanism. When used in conjunction with a feedforward controller, the feedback control is often referred to as a feedback trim element and serves to compensate for inaccuracies in the process model, measurement errors, and unmeasured disturbances.

In one of the embodiments of this invention, the variable to be controlled is the reactive gas (e.g., oxygen) mole fraction present in the chamber and a load variable that can be employed for use in a feedforward block is the target power. This embodiment is illustrated in FIG. 4. With reference to FIG. 4, the control system 130 includes a power sensor 132 for sensing the power provided to the target (target power). The target power is the load variable chosen because target power directly affects the variable to be controlled which is the reactive gas mole fraction present in the chamber. Due to the high temporal resolution provided by the target power supplies, any variance in the load variable can be measured before the variance affects the reactive gas mole fraction present in the chamber. Thus feedforward control is possible in anticipating the expected variance and adjusting the output of the mass flow controller 134 accordingly. The feedforward control system is operated in conjunction with a feedback control element which provides a correction signal to the mass flow controller 134 (i.e., the delivery device) in accordance with the error between the measured value of the reactive gas mole fraction from the RGA 136 and the set point for this controlled variable. A summation of the signals from the feedforward block and the PID controller is provided to the mass flow controller 134.

The feedforward control function represented in Equation 1 shows that there is a term proportional to the load variable, in this case the target power, and a term that is proportional to the rate at which the target power is changing. When the power to the target is first turned on, the feedforward mechanism signals the mass flow controller (or other reactive gas delivery device in operation) to provide an amount of oxygen proportional to the power level of the target plus an amount related to the rate at which the power of the target is changing over time.

FIG. 5 illustrates the theoretical reactive gas flow over time during system start-up using a control system according to one aspect of the present invention. If the system is operating at constant target power it can be seen that once the target has reached its set point, the derivative term will go to zero (as the power is no longer changing with respect to time) and the feedforward system will signal the delivery device to provide an amount of oxygen that is proportional to the target power level. At the same time as the feedforward control is signaling the delivery device, the feedback control (known as the feedback trim element) is also operating. In this instance, the feedback is provided by an RGA which measures the mole fraction present in the system, which value is then compared to the set point and the resultant error generated is used by the PID controller to signal a correction to the mass flow controller. The PID feedback is thereby providing a fine tuned control of the reactive gas concentration (indicated by the shaded area) that compensates for inaccuracies in the model used by the feedforward block, measurement errors, and any unmeasured disturbances in the system. The combination of the feedforward block with the PID trim loop then provides a control of the reactive gas input that allows the system to achieve the desired steady operating state within one second from target start-up. It can also be seen that if there are any disturbances to the power once the sputtering process has reached a steady-state condition (which would upset the reactive gas concentration in the system) the derivative term would once again be active and the feedforward block would anticipate and prevent or minimize the variance in reactive gas mole fraction.

The present invention is not limited to the use of target power as the load variable measured to control the reactive gas input into the system, nor does the reactive gas pressure or mole fraction need to be the controlled variable. It is possible that the system operates with a fixed flow of reactive gas and control the power, voltage, or current to the target instead, choosing whatever load variable seems the most appropriate in each case.

Additionally, the feedforward algorithm may be varied during the coating process. For example, the target power may be selected as the load variable to control the reactive gas concentration during target start-up, but once the system is at its desired operating point, another load variable may be selected to control the same or a different control variable. Target voltage and current are two possible load variables for controlling the system in its desired state. In this case several algorithms could be set up in parallel, with a switch determining which algorithm is selected to provide input to the delivery device at any given time.

FIG. 6 illustrates a system in which the load variable used to control the reactive gas mole fraction is the target voltage. FIG. 7 illustrates a system in which more than one feedforward algorithm is available, with the capacity to switch between them at any point, using a selector 152 to determine which feedforward block is sending input to the delivery device at any one time.

The following example illustrates the ability of the present invention to provide a more rapid stabilization of coating conditions after target start-up than is possible with standard PID control. The experiment was carried out using an industrial MicroDyn® reactive sputtering batch coater. The conditions of the experiment are given in Table 1 below.

TABLE 1

| | |
|---|---|
| Chamber volume: | 700 liters |
| Effective pumping speed: | 1100 liters/sec (Argon) |
| Drum rotation speed: | 60 rpm |
| Targets: | Two AC pairs, 5" × 15" |
| Coating material 1: | Silicon |
| Coating material 2: | Tantalum |
| Delivery device: | Two 0–200 sccm mass flow controllers |
| Microwave power: | 3 kW |
| Target power: | 8 kW, provided by AC power supply operating at 40 kHz |

The length of time required for system stabilization, as determined by measuring the oxygen flow and the oxygen mole fraction present in the chamber, using a standard PID feedback loop can be seen in FIG. 8. With reference to FIG. 8, a standard PID feedback loop requires approximately six to seven seconds to fully stabilize the coating conditions in the chamber. The improved stabilization time that is achieved when a feedforward control mechanism is added to the PID feedback loop are illustrated in FIG. 9.

While preferred embodiments of the present invention have been described, it is to be understood that the embodiments described are illustrative only and that the scope of the invention is to be defined solely by the appended claims when accorded a full range of equivalence, many variations and modifications naturally occurring to those of skill in the art from a perusal hereof.

What is claimed is:

1. In a sputter coating system comprising:
a vacuum chamber having a coating station;
substrate mounting and moving means adapted for passing one or more substrates to be coated through said coating station;
means for introducing a reactive gas into said vacuum chamber at a predetermined rate;
a target operating at a predetermined power level sufficient to create a reactive atmosphere in said coating station and to plasma sputter a selected material onto substrates when passed through said coating station by said substrate mounting and moving means; and
a plasma generator operating at a predetermined power level for increasing the area, density and reactivity of the reactive atmosphere in said coating station,
a method of reactive sputtering comprising the steps of:
(1) operating the plasma generator at a power level at which
(a) the partial pressure of the reactive gas required to convert substantially all of the material sputtered onto the substrates into a different chemical species is below (b) the partial pressure of the reactive gas required for substantially poisoning the target,
so that there is a range of reactive gas partial pressures between
(a) the partial pressure of the reactive gas required to convert substantially all of the material sputtered onto the substrates into a different chemical species and (b) the partial pressure of the reactive gas,
over which it is feasible to monitor the reactive gas partial pressure and to effect control of the reactive gas partial pressure within a predetermined range by feedback control means;
(2) monitoring the partial pressure of the reactive gas;
(3) monitoring a system operating parameter; and
(4) automatically controlling the partial pressure of the reactive gas responsive to variance in (i) the partial pressure of the reactive gas and/or (ii) the system operating parameter by actively controlling the rate of introduction of reactive gas into the chamber to maintain the partial pressure of the reactive gas in the predetermined range of reactive gas partial pressures,
wherein the partial pressure of the reactive gas is automatically controlled responsive to variance in the system operating parameter by feedforward control.

2. The method of claim 1 where the system operating parameter is the target power.

3. The method of claim 1 where the system operating parameter is the target voltage.

4. The method of claim 1 where the system operating parameter is the target current.

5. The method of claim 1 wherein the feedforward control is provided by employing a first feedforward algorithm from system start-up until a predetermined time after system start-up and then employing a second feedforward algorithm.

6. The method of claim 5 wherein the feedforward control is provided by monitoring a first system operating parameter from system start-up until a predetermined time after system start-up and then monitoring a second system operating parameter.

7. The method of claim 1 wherein the feedforward control is provided by monitoring a first system operating parameter from system start-up until a predetermined time after system start-up and then monitoring a second system operating parameter.

8. The method of claim 1 wherein the partial pressure of the reactive gas is automatically controlled responsive to variance in the partial pressure of the reactive gas by feedback control.

9. The method of claim 1 wherein the partial pressure of the reactive gas is monitored by an RGA.

10. In a reactive sputtering system wherein the partial pressure of a reactive gas in a portion of the sputtering chamber is automatically controlled by monitoring the partial pressure of the reactive gas and automatically controlling the partial pressure of the reactive gas by actively controlling the rate of introduction of reactive gas into the chamber to maintain the partial pressure of the reactive gas in a predetermined range of reactive gas partial pressures, a method of improving the automatic control of the reactive gas partial pressure comprising the steps of:

monitoring a first system operating parameter wherein a variance in such parameter affects the partial pressure of the reactive gas; and automatically controlling the partial pressure of the reactive gas by actively controlling the rate of introduction of reactive gas into the chamber responsive to a variance in the first system operating parameter by employing a first feedforward algorithm.

11. The method of claim 10 wherein the partial pressure of the reactive gas is automatically controlled responsive to a variance in the system operating parameter by employing the first feedforward algorithm from the time power is provided to the sputtering target until a predetermined time after power is provided to the sputtering target, and then employing a second feedforward algorithm.

12. The method of claim 11 wherein the first system operating parameter is monitored during employment of the first feedforward algorithm and a second system operating parameter is monitored during employment of the second feedforward algorithm.

13. The method of claim 10 wherein the partial pressure of the reactive gas is automatically controlled responsive to a variance in (i) the first system operating parameter by from the time power is provided to the sputtering target until a predetermined time after power is provided to the sputtering target, and then (ii) a second system operating parameter.

14. The method of claim 10 wherein the first system operating parameter is the target power.

15. A method of maintaining a stable sputtering rate in a reactive sputtering system comprising the steps of:

monitoring a first system operating parameter;

automatically controlling the first system operating parameter to maintain the parameter within a predetermined range responsive to a variance in the first system operating parameter;

monitoring a second system operating parameter; and automatically controlling the first system operating parameter to maintain the parameter within a predetermined range responsive to a variance in the second system operating parameter by employing feedforward control.

16. The method of claim 15 wherein the first system parameter is the partial pressure of reactive gas in the sputtering chamber.

17. The method of claim 16 wherein the second system operating parameter is the target power.

18. A method of automatically maintaining the mole fraction of reactive gas in the sputtering chamber of a reactive sputtering system in a predetermined range, the method comprising the steps of:

sensing the mole fraction of the reactive gas;

varying the flow of reactive gas into the chamber responsive to a variance in the sensed value of the reactive gas mole fraction;

sensing target power; and varying the flow of reactive gas into the chamber responsive to a variance in the sensed value of the target power.

19. A method of automatically maintaining the mole fraction of reactive gas in the sputtering chamber of a reactive sputtering system in a predetermined range, the method comprising the steps of:

sensing a system operating parameter, the parameter being selected such that a variance in the parameter changes the mole fraction of reactive gas introduced into the chamber at a constant mass flow rate; and varying the mass flow rate of reactive gas into the chamber responsive to a variance in the sensed value of the system operating parameter.

20. The method of claim 19 wherein the system operating parameter is selected from the group consisting of target power, target voltage, and target current.

21. The method of claim 19 further comprising the steps of:

sensing the mole fraction of the reactive gas; and varying the mass flow rate of reactive gas into the chamber responsive to a variance in the sensed value of the reactive gas mole fraction.

22. A sputter coating system comprising:

a vacuum chamber having a coating station;

substrate mounting and moving means adapted for passing one or more substrates to be coated through said coating station;

means for introducing a reactive gas into said vacuum chamber at a controllable predetermined rate;

a target operating at a predetermined power level sufficient to create a reactive atmosphere in said coating station and to plasma sputter a selected material onto substrates when passed through said coating station by said substrate mounting and moving means;

a plasma generator operating at a predetermined power level for increasing the area, density and reactivity of the reactive atmosphere in said coating station;

automatic feedback control means for monitoring the partial pressure of the reactive gas in a portion of the chamber and actively maintaining the partial pressure of the reactive gas in the coating station at a predetermined range of steady state reactive gas partial pressures; and automatic feedforward control means for monitoring a system operating parameter and actively maintaining the partial pressure of the reactive gas in the coating station at a predetermined range of reactive gas partial pressures responsive to a variance in the system operating parameter.

23. The system of claim 22 wherein the system operating parameter is the target power level.

24. The system of claim 22 wherein the partial pressure of the reactive gas in the coating station is maintained in the predetermined range of steady state partial pressures within three seconds of applying power to the sputtering target.

25. The system of claim 24 wherein the partial pressure of the reactive gas in the coating station is maintained in the predetermined range of steady state partial pressures within one second of applying power to the sputtering target.

26. A system for automatically maintaining the mole fraction of reactive gas in a sputtering chamber within a predetermined range, said system comprising:
- a mass flow controller for controlling the mass flow rate of the reactive gas into the chamber;
- means for sensing the mole fraction of the reactive gas in the chamber and generating a mole fraction signal;
- feedback controller means for receiving the mole fraction signal and providing a flow control signal to the mass flow controller responsive thereto;
- means for sensing a system operating parameter and generating a load variable signal; and
- feedforward controller means for receiving the load variable signal and providing a flow control signal to the mass flow controller responsive thereto.

\* \* \* \* \*